United States Patent
Kim et al.

(10) Patent No.: US 7,848,178 B2
(45) Date of Patent: Dec. 7, 2010

(54) SEMICONDUCTOR MEMORY DEVICE AND METHOD FOR OPERATING THE SAME

(75) Inventors: Kyung-Hoon Kim, Kyoungki-do (KR); Sang-Sik Yoon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 423 days.

(21) Appl. No.: 12/006,121

(22) Filed: Dec. 31, 2007

(65) Prior Publication Data

US 2009/0116331 A1 May 7, 2009

(30) Foreign Application Priority Data

Nov. 2, 2007 (KR) .................. 10-2007-0111564

(51) Int. Cl.
*G11C 8/00* (2006.01)
(52) U.S. Cl. .................................. 365/233.1; 365/194
(58) Field of Classification Search ............. 365/233.1, 365/233.5, 194
See application file for complete search history.

(56) References Cited

U.S. PATENT DOCUMENTS 7,450,443 B2 * 11/2008 Cheng ........................ 365/193
2002/0196883 A1 * 12/2002 Best et al. .................... 375/355

FOREIGN PATENT DOCUMENTS

JP 2000-124796 4/2000

* cited by examiner

*Primary Examiner*—Anh Phung
(74) *Attorney, Agent, or Firm*—Blakely, Sokoloff, Taylor & Zafman LLP

(57) ABSTRACT

Semiconductor memory device and method for operating the same includes a phase detection unit configured to compare a phase of a first reference clock and a phase of a second divided reference clock to output a comparison result signal and a phase control and division unit configured to generate the second divided reference clock by dividing a second reference clock by a predetermined ratio according to the comparison result signal outputted from the phase detection unit and adjusting a phase of the second reference clock.

25 Claims, 8 Drawing Sheets

SEMICONDUCTOR MEMORY DEVICE AND METHOD FOR OPERATING THE SAME

CROSS-REFERENCE TO RELATED APPLICATIONS

The present invention claims priority of Korean patent application number 10-2007-0111564, filed on Nov. 2, 2007, which is incorporated by reference in its entirety.

BACKGROUND OF THE INVENTION

The present invention relates to a semiconductor memory device, and more particularly, to a semiconductor memory device, which can improve operation reliability by constantly regulating a time necessary for internal operations, and a method for operating the same.

In a system with a variety of semiconductor devices, a semiconductor memory device serves as data storage. The semiconductor memory device outputs data corresponding to addresses received from a data processor, e.g., a central processing unit (CPU), or stores data received from the data processor into unit cells selected by addresses inputted together with the data.

As the operating speed of the system is increasing, the data processor requires the semiconductor memory device to input and output data at higher speed. For the purpose of high-speed data input and output, a synchronous memory device was developed. The synchronous memory device inputs and outputs data in synchronization with a system clock. However, because even the synchronous memory device could not meet the required data input/output speed, a double data rate (DDR) memory device was developed. The DDR memory device outputs or inputs data at falling edges and rising edges of the system clock.

The DDR memory device must process two data during one cycle of the system clock so as to input and output data at a falling edge and a rising edge of the system clock. Specifically, the DDR memory device must output data exactly in synchronization with the rising edge and the falling edge of the clock. To this end, a data output circuit of the DDR memory device outputs data in synchronization with rising and falling edges of the system clock.

Recently, many attempts have been made to increase address input/output speed as well as data input/output speed in semiconductor memory devices capable of processing a large capacity of data at high speed. In a conventional semiconductor memory device, an address is inputted together with an external command in synchronization with a rising edge of a clock. That is, the semiconductor memory device receives an external address and an external command one time during one cycle of an external clock, specifically in synchronization with a rising edge of an external clock. As the operating speed of the semiconductor memory device further increases, a new architecture was proposed which can receive an address two times during one cycle of an external clock.

Graphics double data rate version 5 memory devices are designed to receive addresses at a rising edge and a falling edge of an external clock. That is, the memory devices can receive the addresses two times during one cycle of the external clock. Thus, compared with the general DDR memory device, the number of address pins is reduced and the operating speed can be increased by connecting extra pins to a power voltage terminal or a ground terminal. Since an external command is inputted in synchronization with a rising edge of an external clock, the address input speed is two times faster than a command input speed.

FIG. 1 is a timing diagram illustrating a read operation and a write operation of a memory device.

Referring to FIG. 1, the memory device receives two addresses A1 and A2 during one cycle of a system clock HCLK in a read operation and a write operation, and inputs or outputs four data corresponding to the addresses during one cycle of the system clock HCLK. In the write operation, a write command WR and the addresses A1 and A2 are inputted at a time T1. The write command WR is inputted in synchronization with a rising edge of the system clock HCLK, and the addresses A1 and A2 are inputted in synchronization with a rising edge and a falling edge of the system clock HCLK. Since the memory device can receive the address two times during one cycle of the system clock HCLK, the number of address pins is reduced and the operating speed can be increased by connecting extra pins to a power voltage terminal or a ground terminal.

Data Q0 to Q7 for being outputted according to the write command WR and the addresses A1 and A2 inputted in synchronization with the rising edge or the rising and falling edges of the system clock HCLK are inputted into the memory device through data pads DQ[0:31] in synchronization with an output reference clock REF_CLK having a frequency two times faster than that of the system clock HCLK after a write latency elapses from the input of the write command WR. As described above, the output reference clock REF_CLK, instead of the system clock HCLK, is used as a reference of data input in order to input four data per one cycle of the system clock HCLK.

In the read operation, a read command RD and addresses A1' and A2' are inputted at a time T11. Data Q0 to Q7 corresponding to the addresses A1' and A2' are outputted through data pads DQ[0:31] after a read latency RL elapses from the input of the read command RD. In the read operation, the semiconductor memory device receives two addresses during one cycle of the system clock HCLK and outputs four data corresponding to the addresses during one cycle of the system clock HCLK.

As can be seen in the read operation and the write operation, the memory device uses two clocks, that is, a clock for the input/output of the command and the addresses and a clock for the input/output of the data. The two clocks have different frequencies from each other. More specifically, the clock for the input/output of the command and the addresses has half the frequency of the clock for the input/output of the data. In order to normally maintain the read latency and the write latency, that is, a time difference between the input of the command and the input/output of the data in the read operation and the write operation, the clock for the input/output of the data must be divided and adjusted to have the same phase as the clock for the input/output of the command and the addresses.

FIG. 2 is a timing diagram illustrating an internal operation of the semiconductor memory device for the read operation.

Referring to FIG. 2, the read command RD and the addresses A1 and A2 are inputted to the semiconductor memory device at a time t1 in synchronization with the system clock HCLK. The semiconductor memory device outputs data in synchronization with a data output clock WCLK having two times the frequency of the system clock HCLK. The semiconductor memory device performs a ½ frequency division with respect to the data output clock WCLK to generate divided output clocks WCLK_DV0 and WCLK_DV1.

The semiconductor memory device decodes the read command RD to generate an internal read command ICMD. The internal read command ICMD for data output is recognized in the internal circuits of the semiconductor memory device, based on the data output clock WCLK, not the system clock HCLK. As illustrated in FIG. 2, a read command strobe signal for recognizing the internal read command ICMD is synchronized with the divided output clocks WCLK_DV0 and WCLK_DV1, not the system clock HCLK. The divided output clocks WCLK_DV0 and WCLK_DV1 have the same period as the system clock HCLK because they are generated by the ½ frequency division of the data output clock WCLK having two times the frequency of the system clock HCLK. However, the divided output clock WCLK_DV0 has a phase equal to that of the system clock HCLK, while the divided output clock WCLK_DV1 has a phase different from that of the system clock HCLK.

Due to the read command strobe signal generated in synchronization with the rising edge of the divided output clocks WCLK_DV0 and WCLK_DV1, the read latencies RL1 and RL2 of the semiconductor memory device may be different from each other in the case where the divided output clocks WCLK_DV0 and WCLK_DV1 have a phase equal to that of the system clock HCLK and the case where the divided output clocks WCLK_DV0 and WCLK_DV1 have a phase different from that of the system clock HCLK. That is, a time from the input of the read command RD to the output of the data corresponding to the read command RD may change according to the phases of the divided output clocks WCLK_DV0 and WCLK_DV1 and the system clock HCLK. A difference (RL2−RL1) of the read latencies may be generated in the ½ frequency division of the data output clock WCLK, and it may degrade the operation reliability of the semiconductor memory device.

When there is a change in the read latency and the write latency defined in the specification defining the performance of the semiconductor memory device, a system with the semiconductor memory device may malfunction. Therefore, in order to ensure a stable operation, the semiconductor memory device must always constantly maintain the read latency and the write latency, that is, a time necessary to output data after the read and write commands are inputted.

SUMMARY OF THE INVENTION

Embodiments of the present invention are directed to providing a semiconductor memory device using a plurality of reference clocks with different frequencies, which can perform the internal operations with a constant latency by dividing the plurality of reference clocks and controlling them to have the same phase. In accordance with an aspect of the present invention, there is provided a semiconductor memory device which includes a phase detection unit configured to compare a phase of a first reference clock and a phase of a second divided reference clock to output a comparison result signal; and a phase control and division unit configured to generate the second divided reference clock by dividing a second reference clock by a predetermined ratio according to the comparison result signal outputted from the phase detection unit and adjusting a phase of the second reference clock.

In the semiconductor memory device using a plurality of reference clocks with different frequencies, the existing clocks are divided and their phases are detected and compensated in order to prevent the change of a latency of internal operations due to a phase difference of the plurality of reference clocks. In this way, even though the read and write operations are performed in synchronization with the plurality of reference clocks with the different frequencies, the internal operations can have a constant latency by dividing the reference clocks to have the same frequency and making the reference clocks have the same phases, thereby improving operation reliability of the semiconductor memory device. Further, the external circuits can expect the constant operations of the semiconductor memory device, thereby improving the operation reliability of the system.

DESCRIPTION OF SPECIFIC EMBODIMENTS

Hereinafter, a semiconductor memory device and a method for operating the same in accordance with the present invention will be described in detail with reference to the accompanying drawings.

Figure 1:
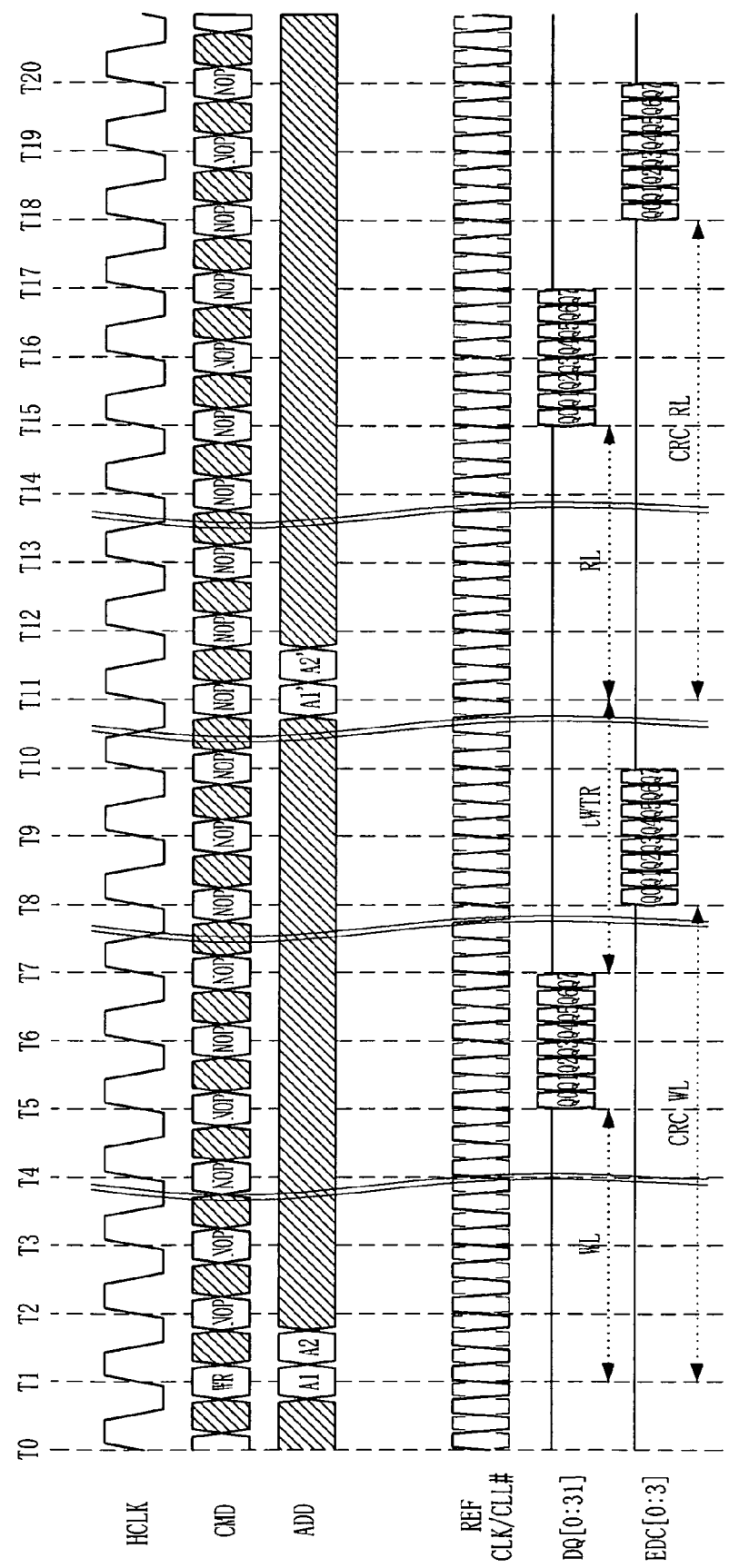
FIG. 1 is a timing diagram illustrating a read operation and a write operation of a memory device.
Figure 2:
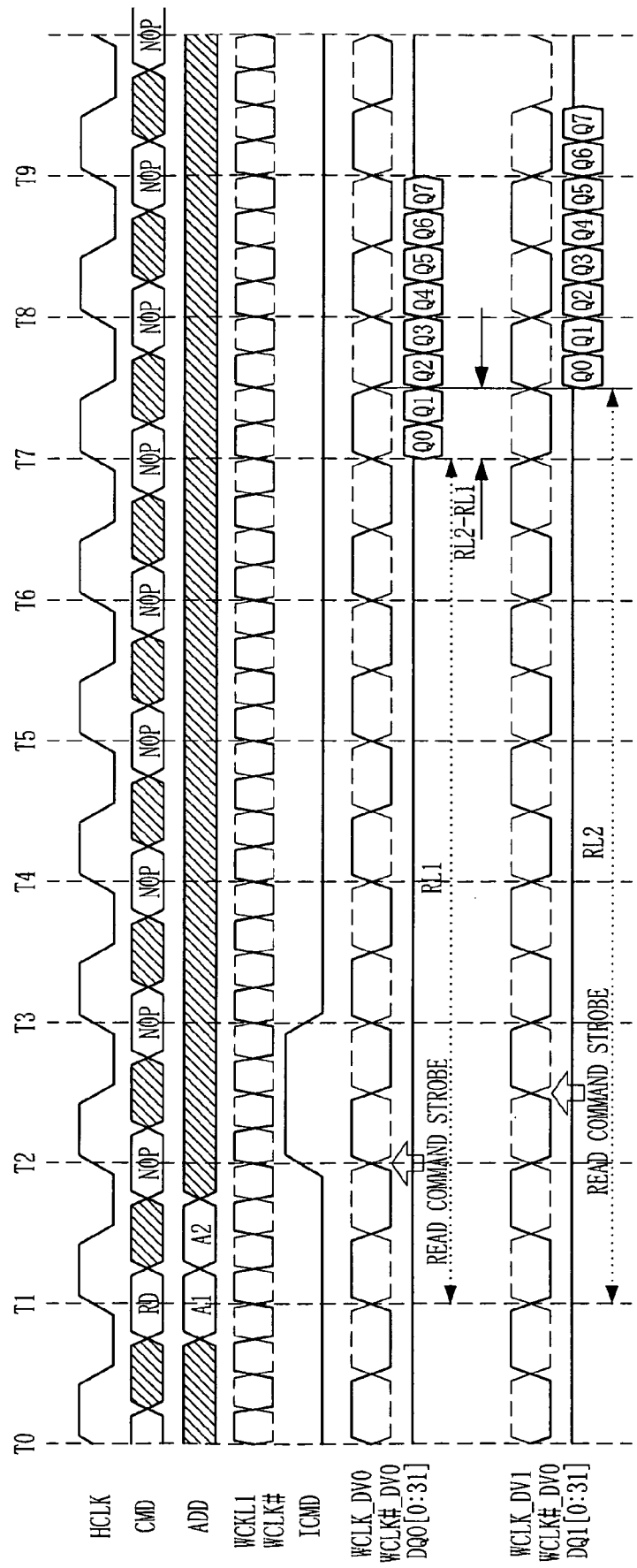
FIG. 2 is a timing diagram illustrating an internal operation of the semiconductor memory device in the read operation.
Figure 3:
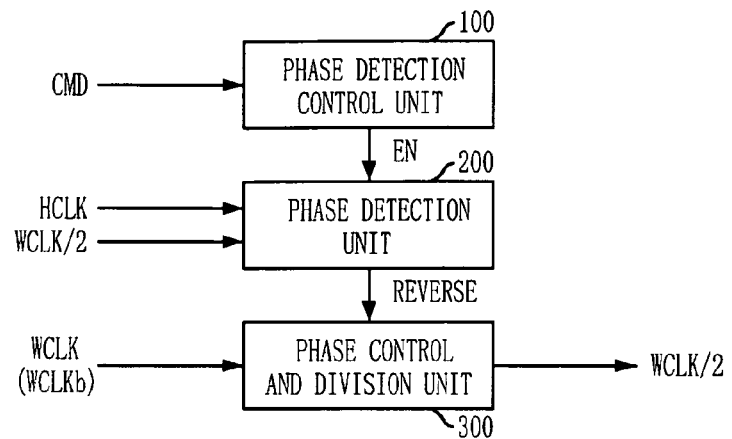
FIG. 3 is a block diagram of a clock controller in a semiconductor memory device in accordance with an embodiment of the present invention.

FIG. 3 is a block diagram of a clock controller in a semiconductor memory device in accordance with an embodiment of the present invention.

Referring to FIG. 3, the clock controller includes a phase detection control unit 100, a phase detection unit 200, and a phase control and division unit 300. The phase detection unit 200 compares a phase of a first reference clock HCLK with a phase of a second divided reference clock WCLK_DV. Specifically, the phase detection unit 200 outputs a reverse control signal REVERSE indicating whether to reverse the phase of a second reference clock WCLK when the phase control and division unit 300 divides the second reference clock WCLK. The phase control and division unit 300 divides the second reference clock WCLK by a predetermined ratio and controls its phase according to the reverse control signal REVERSE to generate the second divided reference clock WCLK_DV having the same phase as the first reference clock HCLK. The phase detection unit 200 and the phase control and division unit 300 are controlled by the phase detection control unit 100 that outputs the control signal according to an external command.

The first reference clock HCLK is a reference clock used for input of an external command and an external address, and the second reference clock WCLK is a reference clock for input/output of data corresponding to the external command and address. For example, a memory device receives two addresses per one cycle of a system clock because it receives addresses in synchronization with a rising edge and a falling edge of a system clock. However, the memory device inputs or outputs four data per one cycle of the system clock. In this embodiment, assuming that the first reference clock HCLK is the system clock and the second reference clock WCLK is the clock for the input/output of the data, a frequency of the first reference clock HCLK can have half of the frequency of the second reference clock WCLK. In this case, the phase control and division unit 300 performs a ½ frequency division with respect to the second reference clock WCLK to generate the second divided reference clock WCLK_DV having the same frequency as the first reference clock WCLK.

Although the phase detection control unit 100 for controlling the phase detection unit 200 and the phase control and division unit 300 are adopted as independent circuits in the semiconductor memory device in FIG. 3, the phase detection unit 200 and the phase control and division unit 300 can be controlled by a mode register set (MRS) configured to determine an operation mode. Further, the phase detection control unit 100 can be designed to enable the phase detection unit 200 and the phase control and division unit 300 by decoding a test signal even in a test operation as well as a normal operation.

Figure 4:
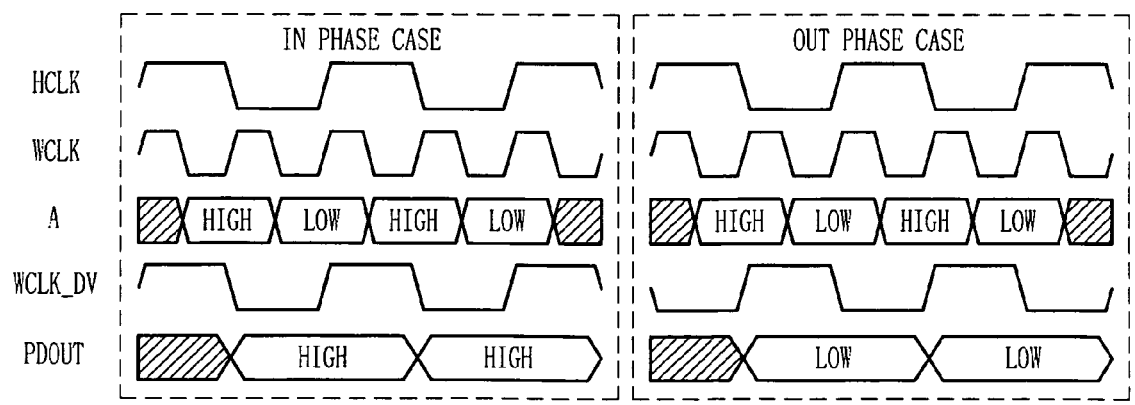
FIG. 4 is a timing diagram illustrating the operation of the semiconductor memory device of FIG. 3.

FIG. 4 is a timing diagram illustrating the operation of the semiconductor memory device of FIG. 3.

Referring to FIG. 4, the phase detection unit 200 compares a phase of the second divided reference clock WCLK_DV with a phase of the first reference clock HCLK. When the phase of the second divided reference clock WCLK_DV is equal to the phase of the first reference clock HCLK, the phase detection unit 200 does not activate the reverse control signal REVERSE. On the other hand, when the phase of the second divided reference clock WCLK_DV is different from the phase of the first reference clock HCLK, the phase detection unit 200 activates the reverse control signal REVERSE.

The timing diagram shown on the left side of FIG. 4 illustrates a case where the phase of the second divided reference clock WCLK_DV is equal to the phase of the first reference clock HCLK, and the timing diagram shown on the right side of FIG. 4 illustrates a case where the phase of the second divided reference clock WCLK_DV is different form the phase of the first reference clock HCLK. When the phase of the second divided reference clock WCLK_DV is equal to the phase of the first reference clock HCLK, the phase detection unit 200 outputs a comparison result signal PDOUT with a logic high level. When the phase of the second divided reference clock WCLK_DV is different from the phase of the first reference clock HCLK, the phase detection unit 200 outputs a comparison result signal PDOUT with a logic low level.

Figure 5:
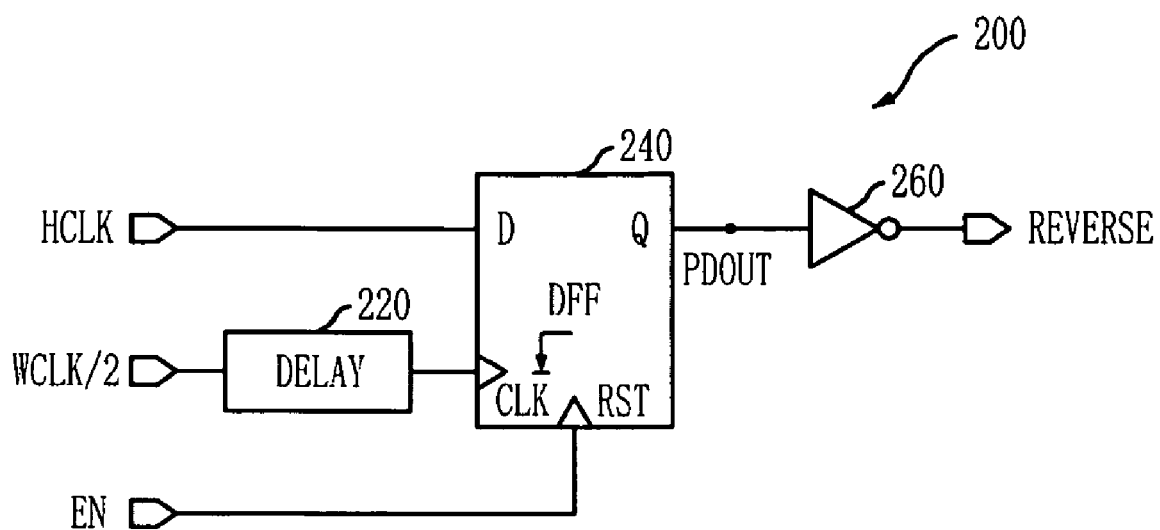
FIG. 5 is a circuit diagram of a phase detection unit of FIG. 3.

FIG. 5 is a circuit diagram of the phase detection unit 200 of FIG. 3.

Referring to FIG. 5, the phase detection unit 200 includes a delay 220 a first flip-flop 240, and a first inverter 260. The delay 220 delays the second divided reference clock WCLK_DV. The first flip-flop 240 compares the phase of the second divided reference clock WCLK_DV with the phase of the first reference clock HCLK and outputs the comparison result signal. The first inverter 260 inverts the output signal of the first flip-flop 240. In this embodiment, the delay 220 for delaying the second divided reference clock WCLK_DV is provided to delay an input signal of the first flip-flop 240 by a predetermined time in order to determine if the phase of the second divided reference clock WCLK_DV is synchronized with the phase of the first reference clock HCLK. In another embodiment, the first reference clock HCLK can be delayed in order to determine the synchronization between the second divided reference clock WCLK_DV and the first reference clock HCLK.

When the phase of the second reference clock WCLK_DV outputted from the phase control and division unit 300 is synchronized with the phase of the first reference clock HCLK, the first flip-flop 240 outputs the comparison result signal PDOUT with a logic high level. On the other hand, when the phase of the second reference clock WCLK_DV outputted from the phase control and division unit 300 is not synchronized with the phase of the first reference clock HCLK, the first flip-flop 240 outputs the comparison result signal PDOUT with a logic low level. The comparison result signal PDOUT is inverted by the first inverter 260 and outputted as the reverse control signal REVERSE.

Figure 6A:
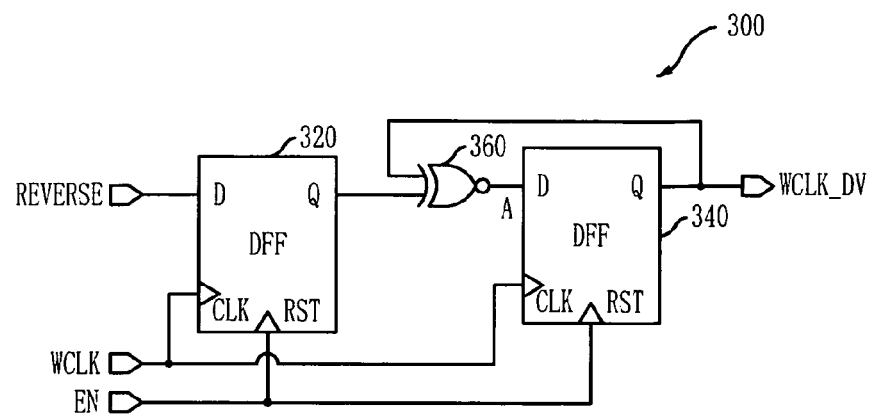
FIG. 6A is a circuit diagram of a phase control and division unit of FIG. 3.

FIG. 6A is a circuit diagram of the phase control and division unit 300 of FIG. 3.

Referring to FIG. 6A, the phase control and division unit 300 includes a second flip-flop 320, a first logic gate 360, and a third flip-flop 340. The second flip-flop 320 is enabled in response to the output signal of the phase detection control unit 100 and is configured to output the reverse control signal REVERSE in synchronization with the second reference clock WCLK. The first logic gate 360 is configured to perform an exclusive NOR (XNOR) operation on an output signal of the second flip-flop 320 and the second divided reference clock WCLK_DV. The third flip-flop 340 is configured to synchronize an output signal of the first logic gate 360 with the second reference clock WCLK to output the second divided reference clock WCLK_DV.

The phase control and division unit 300 can reverse the phase of the second divided reference clock WCLK_DV by performing the XNOR operation on the reverse control signal REVERSE from the phase detection unit 200 and the second divided reference clock WCLK_DV fed back. When the reverse control signal REVERSE is a logic low level, the first logic gate 360 operates as an inverter. On the other hand, when the reverse control signal REVERSE is a logic high level, the first logic gate 360 operates as a buffer that maintains a state. Thus, the phase of the second divided reference clock WCLK_DV fed back is reversed by the third flip-flop 340.

Figure 6B:
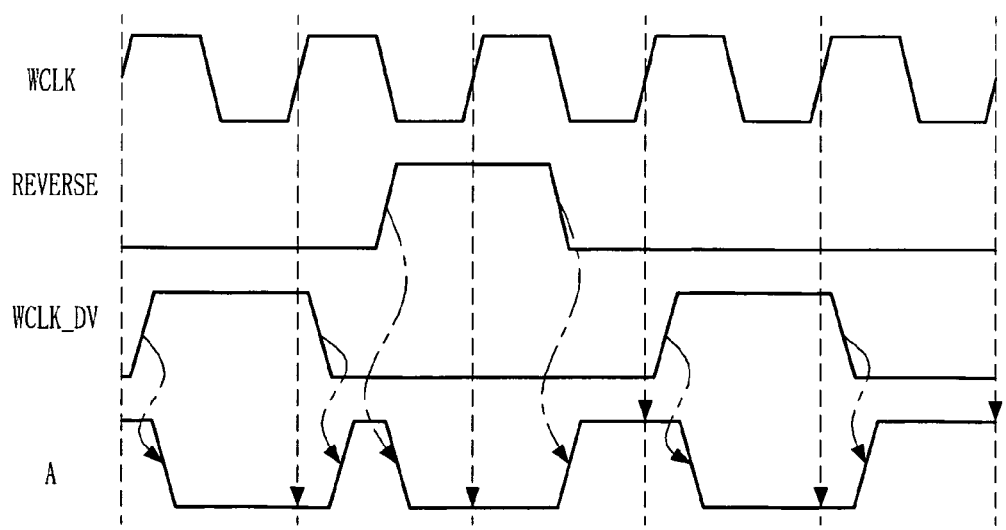
FIG. 6B is a timing diagram illustrating the operation of a phase control and division unit of FIG. 6A.

FIG. 6B is a timing diagram illustrating the operation of the phase control and division unit 300 of FIG. 6A.

Referring to FIG. 6B, a phase at a node A is reversed when the first logic gate 360 performs the XNOR operation on the second divided reference clock WCLK_DV fed back and the reverse control signal REVERSE.

In case that the phase of the divided output clock is reversed, a pulse maintaining a logic high level during one cycle of the second divided reference clock WCLK_DV is inputted to the phase control and division unit 300 and the first logic gate 360 reverses the phase of the second divided reference clock WCLK_DV. That is, the phase of the output signal of the phase control and division unit 300 is reversed when the second divided reference clock WCLK_DV is not synchronized with the first reference signal HCLK.

Figure 7:
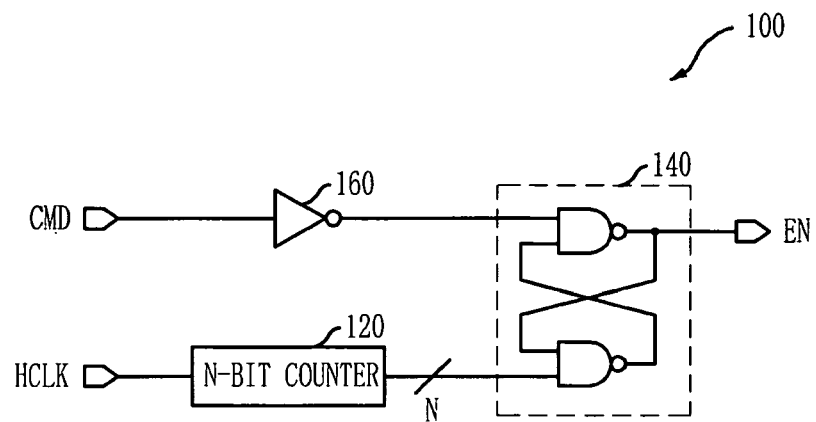
FIG. 7 is a circuit diagram of a phase detection control unit of FIG. 3.

FIG. 7 is a circuit diagram of the phase detection control unit 100 of FIG. 3.

Referring to FIG. 7, the phase detection control unit 100 includes a second inverter 160, a counter 120, and a NAND latch 140. The second inverter 160 is configured to invert the command signal CMD. The counter 120 is configured to count the first reference clock HCLK for N periods. The NAND latch 140 is configured to output the enable signal EN for controlling the phase detection unit 200 and the phase control and division unit 300 in response to an output signal of the second inverter 160 and an output signal of the counter 120.

As described above, since the operation of the phase detection control unit 100 is similar to that of the MRS, it can be replaced with the MRS that decodes the command signal CMD to generate the enable signal EN. In addition, when the phase detection control unit 100 is enabled in a test mode, the phase detection unit 200 and the phase control and division unit 300 are enabled to control the phase of the reference clock and disabled to have a stable latency, thereby maintaining the operation of the semiconductor memory device.

Figure 8:
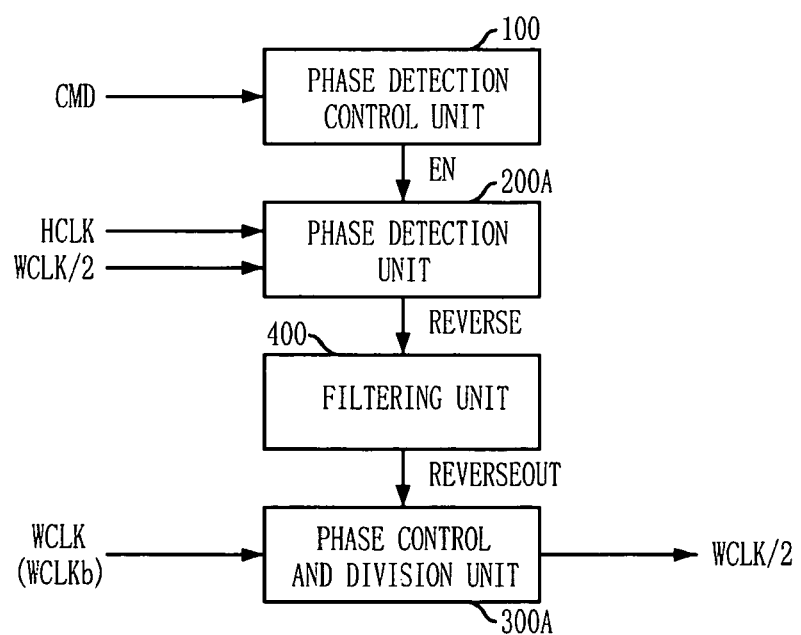
FIG. 8 is a block diagram of a clock controller of a semiconductor memory device in accordance with another embodiment of the present invention.

FIG. 8 is a block diagram of a clock controller of a semiconductor memory device in accordance with another embodiment of the present invention.

Referring to FIG. 8, the clock controller includes a phase detection unit 200A, a filtering unit 400, and a phase control and division 300A. Since the phase detection unit 200A and the phase control and division unit 300A can be configured the same as those of FIG. 3, detailed description thereof will be omitted.

The filtering unit 400 filters the comparison result signal of the phase detection unit 200A for N periods (where N is a natural number) of the first reference clock HCLK. Specifically, if the reverse control signal REVERSE outputted when the phase of the second divided reference signal WCLK_DV and the phase of the first reference signal are different for predetermined periods maintains the same value of a logic high level, the filtering unit 400 outputs the value to the phase control and division unit 300A.

Figure 9:
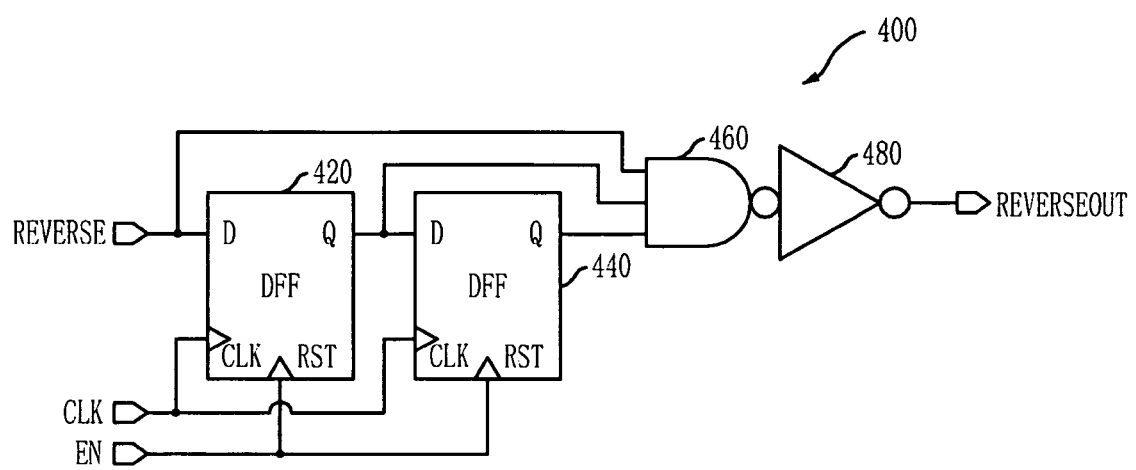
FIG. 9 is a circuit diagram of a filtering unit of FIG. 8.

FIG. 9 is a circuit diagram of the filtering unit of FIG. 8.

Referring to FIG. 9, the filtering unit 400 includes a fourth flip-flop 420, a fifth flip-flop 440, a second logic circuit 460, and a first inverter 480. The fourth flip-flop 420 is configured to receive the reverse control signal REVERSE from the phase detection unit 200A to output it in synchronization with the first reference clock HCLK. The fifth flip-flop 440 is enabled in response to the first reference clock HCLK and configured to output an output signal of the fourth flip-flop 420 in synchronization with the first reference clock HCLK. The second logic gate 460 is configured to perform a NAND operation on the output signals of the phase detection unit 200A and the fourth and fifth flip-flops 420 and 440. The inverter 480 is configured to invert an output signal of the second logic gate 460.

When the phase of the second divided reference clock WCLK_DV is different from the phase of the first reference clock HCLK for predetermined periods, that is, when the reverse control signal REVERSE is inputted with the same value for predetermined periods, the filtering unit 400 activates the reverse filtering signal LPF_OUT. Referring to FIG. 6B, the filtering unit 400 having a digital filter characteristic accumulates three times the comparison result signals, i.e., the reverse control signal REVERSE and determines whether to activate the reverse filtering signal LPF_OUT. The filtering unit 400 prevents the operation reliability from being degraded due to the sensitive operation of the semiconductor memory device even in a negligible error, and improves the operation reliability by reversing the phase of the reference clock.

When the comparison result signal PDOUT is continuously outputted for predetermined periods of the first reference clock HCLK and is maintained at a logic low level because its phase is different from the phase of the first reference clock HCLK, the reverse control signal REVERSE with a logic high level is filtered by the filtering unit 400 and the reverse filtering signal LPF_OUT with a logic high level is transferred to the phase control and division unit 300A. Although the filtering unit 400 filters the comparison result signal for 3 periods in the above embodiment, the periods can be changed according to circumstances.

Figure 10:
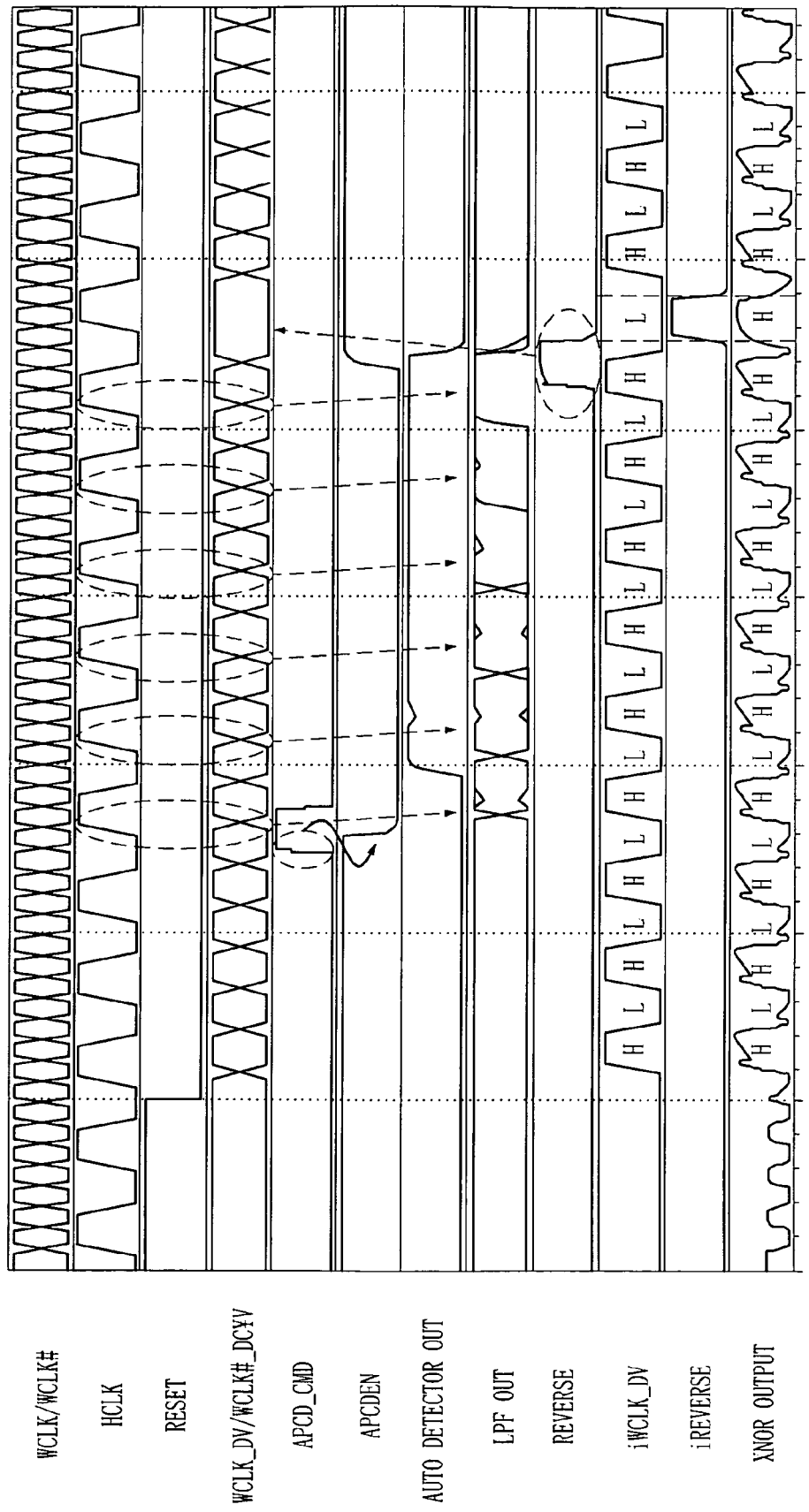
FIG. 10 is a timing diagram illustrating the operation of the semiconductor memory device of FIG. 8.

FIG. 10 is a timing diagram illustrating the operation of the semiconductor memory device of FIG. 8.

Referring to FIG. 10, when the second reference clocks WCLK and WCLK# have two times the frequency of the first reference clock HCLK and the reset signal RESET is deactivated to a logic low level, the phase control and division unit performs a ½ frequency division operation on the second reference clock WCLK and WCLK# to generate the second divided reference clocks WCLK_DV and WCLK_DV# having the same frequency as the first reference clock HCLK.

When the external command is inputted, its decoded signal APCD_CMD is activated and the enable signal EN is activated for predetermined periods by the phase detection control unit 100. The phase detection unit 200 compares the first reference clock HCLK with the second divided reference clock WCLK to output the comparison result signal together with the reverse control signal REVERSE. The filtering unit 400 outputs the reverse filtering signal LPF_OUT for phase reverse when the reverse control signal REVERSE is continuously inputted with the same value for predetermined periods. The phase control and division unit 300 reverses the phase of the second divided reference clock WCLK_DV outputted in response to the reverse filtering signal LPF_OUT.

As described above, the semiconductor memory device using a plurality of reference clocks with different frequencies can perform the read and write operations with a constant latency by dividing the plurality of reference clocks and controlling them to have the same phase. Therefore, the external circuits can expect the constant operations of the semiconductor memory device, thereby improving the operation reliability of the system.

In accordance with the embodiments of the present invention, the semiconductor memory device can maintain a stable operation and ensure a preset latency even though the internal operations are performed using the plurality of reference clocks with different frequencies with respect to the external command.

Further, even when a plurality of reference clocks are used with respect to a plurality of internal operations performed in respect to the external command, the semiconductor memory device can have a constant latency with respect to the external command by dividing the reference clocks to have the same frequencies and compensating their phases. Consequently, a stable operation can be ensured through design modifications even though internal architectures and requirements of input/output data and signals are changed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a phase detection unit configured to compare a phase of a first reference clock and a phase of a second divided reference clock to output a comparison result signal; and
a phase control and division unit configured to generate the second divided reference clock by dividing a second reference clock by a predetermined ratio according to the comparison result signal outputted from the phase detection unit and adjusting a phase of the second reference clock,
wherein the first reference clock is a reference clock for input of an external command and address.

2. The semiconductor memory device as recited in claim 1, wherein the second reference clock is a reference clock for input and output of data corresponding to the external command and address.

3. The semiconductor memory device as recited in claim 2, wherein the first reference clock has half the frequency of the second reference clock, and the phase control and division unit performs a ½ frequency division operation on the second reference clock to generate the second divided reference clock having the same frequency as that of the first reference clock.

4. The semiconductor memory device as recited in claim 1, wherein the phase detection unit comprises:
   a delay configured to delay the second divided reference clock; and
   a first flip-flop configured to compare a phase of the second divided reference clock with a phase of the first reference clock to output the comparison result signal.

5. The semiconductor memory device as recited in claim 4 further comprising a filtering unit configured to filter the output signal of the phase detection unit for N periods, where N is a natural number.

6. The semiconductor memory device as recited in claim 5, wherein the filtering unit comprises:
   a second flip-flop enabled in response to an output signal of the phase detection unit and configured to output an output signal of the first flip-flop in synchronization with the first reference clock;
   a third flip-flop (340) enabled in response to the output signal of the phase detection unit and configured to output an output signal of the second flip-flop in synchronization with the first reference clock;
   a first logic gate configured to perform a NAND operation on output signals of the first to third flip-flops; and
   a first inverter configured to invert an output signal of the first logic gate.

7. The semiconductor memory device as recited in claim 1, wherein the phase control and division unit comprises:
   a first flip-flop enabled in response to an output signal of the phase detection unit and configured to output the output signal of the phase detection unit in synchronization with the second reference clock;
   a first logic gate configured to perform an exclusive NOR (XNOR)QA operation on an output signal of the first flip-flop and the second divided reference clock; and
   a second flip-flop configured to output the second divided reference clock by synchronizing an output signal of the first logic gate with the second reference clock.

8. The semiconductor memory device as recited in claim 1, further comprising a phase detection control unit configured to control the phase detection unit in response to the external command.

9. The semiconductor memory device as recited in claim 8, wherein the phase detection control unit comprises:
   a first inverter configured to invert the external command;
   a counter configured to count the first reference clock for predetermined periods; and
   a NAND latch configured to control the phase detection unit and the phase control and division unit in response to output signals of the first inverter and the counter.

10. The semiconductor memory device as recited in claim 1, further comprising a control unit configured to enable the phase detection unit in response to a test command.

11. The semiconductor memory device as recited in claim 1, further comprising a mode register set (MRS) configured to decode an external command to control the phase detection unit.

12. A semiconductor memory device, comprising:
   a plurality of reference clocks having different frequencies; and
   a clock control circuit configured to make the plurality of reference clocks have equal frequencies, compare phases of the plurality of reference clocks, and control the plurality of reference clocks to have equal phases when the phases of the plurality of reference clocks are different from one another, thereby maintaining a constant latency in operations,
   wherein the plurality of reference clocks comprises a first reference clock for input of an external command and address.

13. The semiconductor memory device as recited in claim 12, wherein the plurality of reference clocks, further comprising: a second reference clock for input and output of data corresponding to the external command and address.

14. The semiconductor memory device as recited in claim 13, wherein the first reference clock has half the frequency of the second reference clock, and the phase control and division unit performs a ½ frequency division operation on the second reference clock to generate the second divided reference clock having the same frequency as that of the first reference clock.

15. The semiconductor memory device as recited in claim 12, further comprising:
   a phase detection unit configured to compare a phase of the first reference clock and a phase of the second divided reference clock to output a comparison result signal; and
   a phase control and division unit configured to generate the second divided reference clock having the same phase as the first reference clock by dividing the second reference clock by a predetermined ratio according to the comparison result signal outputted from the phase detection unit and adjusting a phase of the second reference clock.

16. The semiconductor memory device as recited in claim 15, wherein the phase detection unit comprises:
   a delay configured to delay the second division reference clock; and
   a first flip-flop configured to compare a phase of the second divided reference clock with a phase of the first reference clock to output the comparison result signal.

17. The semiconductor memory device as recited in claim 16, further comprising a filtering unit configured to filter the output signal of the phase detection unit for N periods, where N is a natural number.

18. The semiconductor memory device as recited in claim 17, wherein the filtering unit comprises:
   a first flip-flop enabled in response to an output signal of the phase detection unit and configured to output an output signal of the first flip-flop in synchronization with the first reference clock;
   a second flip-flop enabled in response to the output signal of the phase detection unit and configured to output an output signal of the second flip-flop in synchronization with the first reference clock;
   a first logic gate configured to perform a NAND operation on output signals of the first to third flip-flops; and
   a first inverter configured to invert an output signal of the first logic gate.

19. The semiconductor memory device as recited in claim 15, wherein the phase control and division unit comprises:
   a first flip-flop enabled in response to an output signal of the phase detection unit and configured to output the output signal of the phase detection unit in synchronization with the second reference clock;
   a first logic gate configured to perform an exclusive NOR (XNOR) operation on an output signal of the first flip-flop and the second divided reference clock; and a second flip-flop configured to output the second divided reference clock by synchronizing an output signal of the first logic gate with the second reference clock.

20. The semiconductor memory device as recited in claim 15, further comprising a phase detection control unit configured to control the phase detection unit in response to the external command.

21. The semiconductor memory device as recited in claim 15, wherein the phase detection control unit comprises:
   a first inverter configured to invert the external command;
   a counter configured to count the first reference clock for predetermined periods; and
   a NAND latch configured to control the phase detection unit and the phase control and division unit in response to output signals of the first inverter and the counter.

22. The semiconductor memory device as recited in claim 15, further comprising a mode register set (MRS) configured to decode an external command to control the phase detection unit.

23. A method for operating a semiconductor memory device, the method comprising:
   receiving addresses in response to a plurality of reference clocks having different frequencies, and receiving and outputting data corresponding to the received address
   making the plurality of reference clocks have equal frequencies, comparing phases of the plurality of reference clocks, and controlling the plurality of reference clocks to have equal phases when the phases of the plurality of reference clocks are different from one another, thereby maintaining a constant latency in operations,
   wherein the plurality of reference clocks comprises a first reference clock for input of an external command and address.

24. The method as recited in claim 23, wherein the plurality of reference clocks, further comprising: a second reference clock for input and output of data corresponding to the external command and address.

25. The method as recited in claim 24, wherein the maintaining of the constant latency comprises:
   comparing a phase of the first reference clock and a phase of the second divided reference clock to output a comparison result signal;
   generating the second divided reference clock having the same phase as the first reference clock by dividing the second reference clock by a predetermined ratio according to the comparison result signal and adjusting a phase of the second reference clock; and
   controlling a phase detection unit in response to the external command.

* * * * *